United States Patent [19]

Heinen et al.

[11] Patent Number: 4,845,723

[45] Date of Patent: Jul. 4, 1989

[54] LASER TRANSMITTER ARRANGEMENT

[75] Inventors: Jochen Heinen, Haar; Franz Kappeler, Puchheim, both of Fed. Rep. of Germany

[73] Assignee: Siemens Aktiengesellschaft, Munich, Fed. Rep. of Germany

[21] Appl. No.: 158,749

[22] Filed: Feb. 22, 1988

[30] Foreign Application Priority Data

Feb. 20, 1987 [DE] Fed. Rep. of Germany ....... 3705501

[51] Int. Cl.$^4$ ............................................. H01S 3/00
[52] U.S. Cl. ..................................... 372/38; 372/43; 372/50
[58] Field of Search ...................... 372/43, 44, 50, 38

[56] References Cited

FOREIGN PATENT DOCUMENTS

| 0149042 | 11/1984 | European Pat. Off. |
| 3124633 | 3/1982 | Fed. Rep. of Germany |
| 3401102 | 7/1985 | Fed. Rep. of Germany |
| 56-46588 | 4/1981 | Japan |
| 58-100480 | 6/1983 | Japan |
| 61-26277 | 2/1986 | Japan |
| 61-44487 | 3/1986 | Japan |
| 2144912 | 3/1985 | United Kingdom |

OTHER PUBLICATIONS

Publication by Nakano et al., titled "Monolithic Integration of Laser Diodes, Photomonitors, and Laser Driving and Monitoring Circuits on a Semi-Insulating GaAs", Journal of Lightwave Tech., vol. LT-4, No. 6, Jun. 1986, pp. 574–582.
Publication by Su et al., entitled "Ultra-High-Speed Modulation of 1.3-um InGaAsP Diode Lasers", pp. 1568–1578, IEEE Journal of Quantum Electronics, vol. QE-22, No. 9, Sep. 86.
Publication by Yamamoto et al., entitled "Continuous Control of Coherence Length in Separately Pumped (AlGa) As Lasers", Appl. Phys. Lett., 49(18)3, Nov. 1986, pp. 1129–1131.
Publication entitled "Monolithic Integration of a GaAlAs Injection Laser with a Schottky-Gate Field Effect Transistor", Appl. Phys. Lett, 36(3), 2/1/80, pp. 181–183 by Fukuzawa et al.
Publication entitled: "Very High Frequency GaAlAs Laser Field-Effect Transistor Monolithic Integrated Circuit", Appl. Phys. Lett, 41(2), 7/15/82, pp. 126–128, by Ury et al.
Publication by Katz, entitled "Phase-Locked Semiconductor Laser Array with Separate Contacts", pp. 521–523, Appl. Phys. Lett, 43(6), 9/15/83.

Primary Examiner—William L. Sikes
Assistant Examiner—Georgia Y. Epps

[57] ABSTRACT

A laser transmitter arrangement includes a plurality of laterally coupled semiconductor lasers along with drive components integrated on a single semiconductor body. The drive components include drop resistors, an inductance element, a capacitance element and are all applied to an insulating layer on the surface of the semiconductor body. The resistors are formed by interconnects, while the inductance element is a spiral interconnect and the capacitance element is formed by interconnects lying over one another with an intervening dielectric material. Electrical connection from contact surfaces of the semiconductor lasers to the drive components is provided by the interconnects. The semiconductor body also contains external contacting surfaces for a DC source and for a high frequency source.

21 Claims, 1 Drawing Sheet

LASER TRANSMITTER ARRANGEMENT

BACKGROUND OF THE INVENTION

1. Field of the Invention

The present invention is generally directed to a laser transmitter arrangement having at least one semiconductor laser and associated drive components.

2. Description of the Related Art

Laser transmitters having laterally coupled semiconductor lasers find important uses in communications technology because of their dynamic single-frequency operating properties. The structure and operation of such coupled semiconductor lasers are disclosed in European Patent No. 01 49 042 A2. In the disclosed arrangement, partially laterally coupled semiconductor lasers having separately drivable electrodes provide a laser transmitter having dynamic single-frequency properties that is beneficial for communications-oriented purposes. Individual lasers of the disclosed arrangement are supplied with defined operating currents which set the operating points thereof. Drive components which are required for driving the lasers are connected to the semiconductor lasers as discrete components.

A number of combinations of one or more semiconductor lasers with various drive components exist in the prior art. For example, German published application No. 3 124 633 A1 discloses a semiconductor laser having a transistor for driving the semiconductor laser which is integrated into the semiconductor layer sequence grown on a substrate. The disclosed arrangement has a characteristic feature which is that a trench having a V-shaped cross section is recessed in the upper most semiconductor layer. The trench is filled with a semiconductor material of the opposite conductivity type of the underlying material. Only various contacts for connecting electrodes are situated on the surface of the disclosed apparatus.

A published British application GB No. 2 144 912A discloses a structure having a laser diode and drive components, in which an exemplary embodiment has two transistors and an inductor. The laser diode and the drive components are mounted on a plate of ceramic that is secured within a housing. The structure in and of its self is not essential but the function of the elements interconnected in this structure is.

A published Japanese application JP No. 58-100 480 discloses a semiconductor laser format having additional semiconductor layers provided for integration of a transistor for driving the laser diode.

A published Japanese application JP No. 61-444 87 discloses an arrangement having a semiconductor laser chip, together with a circuit for protection against overvoltage, secured on a common substrate and conductively connected with a gold wire.

In a published Japanese application JP No. 61-262 77 is disclosed a semiconductor laser chip having three integrated field effect transistors. The functional elements of the disclosed structure are situated on a GaAs substrate in a vertical arrangement with the field effect transistors in the lower part and the laser diode in the upper part.

A similar structure of a semiconductor laser having an integrated field effect transistor with the field effect transistor situated in a lower part of a semiconductor layer structure and a laser diode formed in the upper semiconductor layers is disclosed by I. Ury and K. Y. Lau in Applied Physics Letters 41, pages 126 through 128 (1982).

In the publication in Applied Physics Letters 36, pages 181 through 183 (1980), T. Fukuzawa et al. disclose a semiconductor laser structure having a monolithically integrated field effect transistor, where both the laser as well as the FET are formed side by side at the surface of a semiconductor layer structure. Here, the FET also serves to drive the laser.

H. Nakano et al. in "Monolithic Integration of Laser Diodes, Photomonitors, and Laser Driving and Monitoring Circuits on a Semi-Insulating GaAs", Journal of Lightwave Technology LT-4, pages 574 through 582 (1986) recite a monolithic integration of laser diodes and photodiodes with circuits. The disclosed circuits serve to drive the laser and provide feedback for monitoring the radiant intensity of the laser. The circuits are composed of field effect transistors and of resistors which are applied to the surface of the FET. Only one laser diode and one photodiode are operated through these control circuits. A second laser diode and a second photodiode that are operated without control circuits are provided for comparison. The difference in comparison to the publications cited above is that a greater plurality of electronic function elements are monolithically integrated into the semiconductor component and the circuits have a more complex structure.

SUMMARY OF THE INVENTION

An object of the present invention is to provide a structure advantageous for simplified manufacturing and for simple dimensionability of drive components for a laser transmitter arrangement which can be driven with optimally few voltage sources.

This and other objects are inventively achieved with a laser transmitter arrangement having a semiconductor substrate upon which are epitaxially deposited additional semiconductor layers which include at least one laser active layer. In this laser active layer radiation is generated. Further means are provided to form a strip-like active region. A conductive coating and contact surface lie over the pn-junction through which power is applied for operation of at least one laser strip.

At least one resistor element connected to operate as a drive component for the laser strip is formed as a conductor or interconnect applied to the surface of the laser transmitter arrangement. Further drive components, including at least one capacitance element, and at least one inductance element are formed by interconnects applied directly to the surface of the laser transmitter arrangement, the drive components operating to drive the laser strip. The electrical properties of the drive components are established by the conductor material of which the interconnects are formed as well as the geometrical dimensions of the respective components.

Further developments of the invention include forming each of the inductance elements as a spirally applied interconnect and each of the capacitance elements as two superimposed interconnects with an intervening dielectric material. Each inductance element of a preferred arrangement is connected through a drop resistor to the contact surface of one of the laser strips. One interconnect of each capacitance element of the preferred arrangement is connected to a first external contacting surface while the other interconnect of the capacitance element is connected to the surface contact of the laser strip. An inductance element is preferably provided for each capacitance element. Each inductance element is connected to a second external contacting surface for the laser transmitter arrangement.

In an embodiment having two or more laser strips, a drop resistor is connected to each contact surface for every laser strip. Ones of the drop resistors are connected directly to the second external contacting surface of the laser transmitter arrangement, while remaining ones of the drop resistors are connected to the second external contacting surface through the inductance elements. Preferably, the laser strips extend parallel to one another and are laterally coupled.

In another development, an insulating layer is provided to electrically insulate the drive components of the invention from the epitaxially deposited layers of semiconductor material.

In general, one current source is provided for every laser. A current feed is also possible by attaching drop resistors in a suitable relationship to fewer current sources than the number of lasers. Ideally, a single current source is provided for a plurality of lasers. During operation, at least one laser is provided with a modulated current signal. To block the modulated signal of an alternating signal source from reaching a DC power supply, a capacitance element is provided as a low frequency barrier to block low frequency signals and an inductance element is provided as a high frequency barrier to block high frequency signals from reaching the DC power supply.

For the format of the present invention, the drive components for the laser strips are formed as interconnects applied to the surface of the component and are thus integrated into the component. Among other advantages of the invention are that a new laser transmitter arrangement is provided having improved high frequency properties and is simpler to reproduce.

DESCRIPTION OF THE PREFERRED EMBODIMENTS

Figure 1:
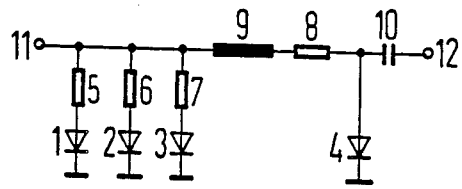
FIG. 1 is a circuit diagram of one possible laser transmitter circuit, having four semiconductor lasers, according to the principles of the present invention.

In FIG. 1, four semiconductor lasers 1, 2, 3 and 4 are shown connected in a circuit. The semiconductor laser 4 is charged with a signal from a high frequency signal source 12. To shield a DC power source 11 and the high frequency signal source 12 from one another, an inductance element 9 is interposed at the side of the DC current source 11 and a capacitance element 10 is interposed at the side of the high frequency signal source 12. Voltage drop resistors 5, 6, 7 and 8 serve to set the operating currents to the semiconductor lasers 1, 2, 3 and 4, respectively, connected thereto. Thus, the high frequency signal of the high frequency signal source 12 is applied to the laser 4, while only a DC signal is applied to the lasers 1, 2, and 3.

Figure 2:
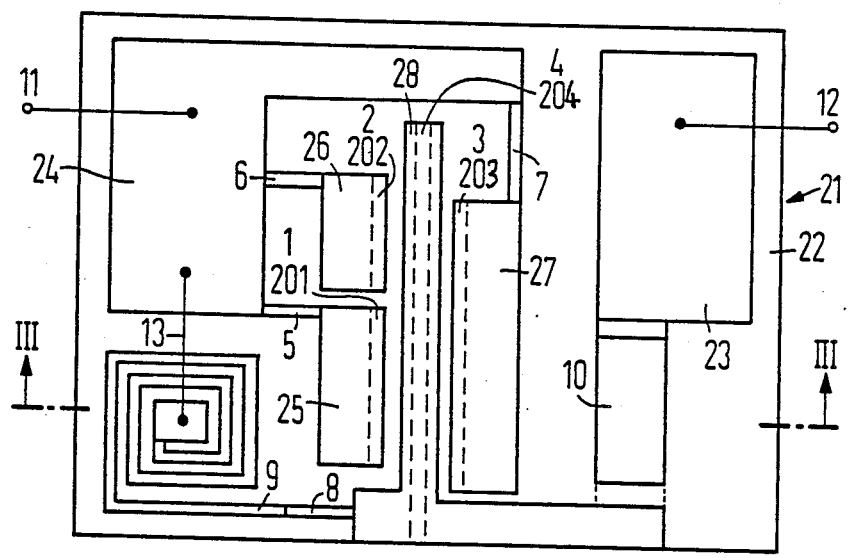
FIG. 2 is a plan view of an exemplary embodiment of a laser transmitter arrangement of the present invention.

In FIG. 2 is shown a plan view of an integrated circuit structure of the semiconductor laser arrangement and drive components from the circuit diagram of FIG. 1. The semiconductor lasers 1, 2, 3 and 4 are situated in the middle region of the top surface of a semiconductor body 21 and are provided with contact surfaces 25, 26, 27 and 28. The contact surfaces 25–28 are connected to respective strip-shaped conductive coatings 201, 202, 203 and 204 for each of the active laser strips 1, 2, 3 and 4 which lie deeper in the semiconductor body 21 (see FIG. 3). The semiconductor lasers 1–4 are connected to drive components through their respective contact surfaces 25–28.

The drive components include the drop resistors 5, 6, 7 and 8 which are composed of interconnects. The dimensions of the interconnects are determined by the conductivity of the interconnect, which is adjustable on the basis of the length, width, height and material and coating thereof. For example, some interconnect material can be eliminated by etching with laser beams for fine tuning or matching of the resistance value during the operation of the laser transmitter arrangement. The resistors 5, 6, 7, and 8 may have any resistance value, including zero resistance.

The inductance element 9 is produced as a spiral interconnect on the surface of the semiconductor body 21. The inductance element 9 is defined by the length and width of the interconnect and by the track spacing of the spiral coils. The inductance element 9 can either partially or entirely also assume the function of the drop resistor 8. In the illustrated embodiment, connection of the induction element 9 to the DC power source 11 is provided by a connecting wire 13, of, for example, gold and aluminum. The connecting wire 13 contacts the central portion of the spiral inductance element 9 and extends to an external contacting surface 24 for connection to the DC power source 11.

The capacitor element 10 is likewise provided on the surface of the semiconductor body 21, the structure of the capacitor 10 being set forth hereinafter with reference to FIG. 3. The contacting surface 24 for the DC current connection 11 and an external contacting surface 23 for connection to the high frequency signal source 12 preferably lie at edge regions of the surface of the semiconductor body 21 in order to facilitate easy contacting by the external signal sources. Thus, the external contacting surfaces 23 and 24 provide conductive surfaces to which elements external to the device may be connected.

Figure 3:
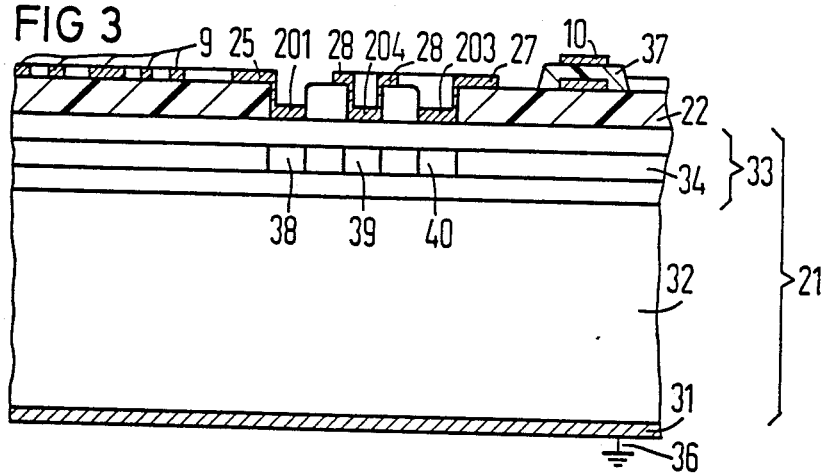
FIG. 3 is a cross section along line III—III of Figure 2 showing the exemplary laser transmitter arrangement.

With reference now to FIG. 3, the semiconductor body 21 is composed of a metal layer 31 on a lower surface, a substrate layer 32 which is preferably of III-IV semiconductor material, and epitaxially deposited semiconductor layers 33 applied over the substrate 32. The metal layer 31 serves to fasten a cooling member (not shown) by alloying which is applied to the underside of the substrate layer 32. The metal layer 31 can also serve as a cooling member. In the epitaxially deposited semiconductor layers 33 is included an laser active layer 34. Laser active strips 35, 38, 39 and 40 are generated in the active laser layer 34 such as by radiation generated pn-junctions (the laser active strip 35 is not visible in the cross section of FIG. 3). Feed current to the active laser strips 35, 38, 39 and 40 is provided through the strip-shaped, conductive coatings 201, 202, 203 and 204. The active laser strips 35, 38, 39 and 40 of the laser diodes 1–4 are of different lengths and have their respective optical axis lying parallel to one another in the semiconductor body 21. As is known, lateral coupling to achieve dynamic single-frequency properties is thereby achieved.

An insulating layer 22 of, for example, oxide or nitride, is situated on the epitaxially deposited layers 33 in a preferred embodiment. The insulating layer 22 lies between the strip-shaped conductive coatings 201-204. The contact surfaces 25, 26, 27 and 28 of the semiconductor lasers 1-4 are situated on the insulating layer 22 and are connected through the insulating layer 22 to the strip-shaped conductive coatings 201-204. The drive components 5, 6, 7, 8, 9 and 10 and the contacting surfaces 23 and 24 for the high frequency signal source 12 and the DC current source 11, respectively are applied on the insulating layer 22, as well.

As can be seen at the upper right hand portion of FIG. 3, the capacitor 10 is composed of two interconnects lying one on top of another with an intervening dielectric material 37. The dielectric material 37 is, for example, silicon oxide, aluminum oxide, or silicon nitride. The type, area and thickness of the dielectric 37 in the capacitor 10 is variable to adjust the capacitance value of the capacitor element 10. A ground terminal 36 for the laser transmitter circuit is connected to the metal layer 31 and/or to the cooling body (not shown).

Although four laser diodes are shown in the illustrated embodiment, it is, of course, possible that any number of lasers be provided, including only one. The interconnects of the illustrated embodiment are preferably of a metallic material.

A laser transmitter arrangement of the invention is, thus, disclosed which has the advantages of providing the drive components for the laser transmitter integrated onto the surface of a single semiconductor body. Such an integrated laser transmitter arrangement is in an economical format and provides for simple dimensionability of the drive components, as well as simplified manufacturing and assembly.

Although other modifications and changes may be suggested by those skilled in the art, it is the intention of the inventors to embody within the patent warranted hereon all changes and modifications as reasonably and properly come within the scope of their contribution to the art.

We claim:

1. A laser transmitter arrangement, comprising:
a substrate layer of III-V semiconductor material;
layers of semiconductor material epitaxially deposited on said substrate layer;
said layers including at least one laser active layer;
at least one laser strip having an appertaining conductive coating and a contact surface;
at least one resistor element formed of a conductor and connected as a drive component for said at least one laser strip to said contact surface of said at least one laser strip, said at least one resistor element being electrically insulated from said semiconductor material of said epitaxially deposited layers;
at least one capacitance element connected as a drive component for said at least one laser strip;
at least one inductance element connected as a drive component for said at least one laser strip;
said drive components being formed of a conductor material applied as interconnects directly to a surface of said laser transmitter arrangement, and said drive components for said at least one laser strip each having prescribed electrical dimensions that are established by both said conductor material of which said drive components are formed and geometrical dimensions of said drive components.

2. A laser transmitter arrangement as claimed in claim 1, wherein:
each of said at least one inductance element is formed as a spirally arranged interconnect;
each of said at least one capacitance element is formed of two superimposed ones of said interconnects and an intervening dielectric; and further comprising:
one of said at least one resistor element being a drop resistor connecting each of said at least one inductance element and said contact surface of said at least one laser strip;
each of said at least one capacitance element having one of said interconnects connected to a first external contacting surface, a second one of said interconnects of each of said at least one capacitance element being connected to said contact surface of at least one laser strip;
one of said at least one inductance element being connected to each one of said at least one capacitance elements through said drop resistor connected to said contact surface of said at least one laser strip, said contact surface being connected to another one of said interconnects of said capacitance element; and
each of said at least one inductance elements being connected to a second external contacting surface.

3. A laser transmitter arrangement as claimed in claim 1, wherein
said at least one laser strip further comprises a further laser strip to provide at least two laser strips, and
said at least one resistor element includes further resistor elements to provide a plurality of resistor elements, one of said plurality of resistor elements being a drop resistor connected to said contact surface of each of said at least two laser strips to form a drive component for said at least two laser strips, ones of said drop resistors being directly connected to a second external contacting surface, and remaining ones of said drop resistors being connected to said second external contacting surface by said at least one inductance element.

4. A laser transmitter arrangement as claimed in claim 3, wherein said at least two laser strips extend parallel to one another and are laterally coupled.

5. A laser transmitter arrangement as claimed in claim 1, further comprising: an insulating layer disposed on said expitaxially deposited layers to electrically insulate said drive components from said epitaxially deposited layers of semiconductor material.

6. An integrated laser transmitter arrangement, comprising:
a substrate;
a plurality of semiconductor layers on said substrate and including a laser active region in said semiconductor layers;
a conductive coating overlying said laser active region through which power is supplied to activate said laser active region;
a first conductive interconnect applied to a surface of said transmitter arrangement connected to said conductive coating and being of a material and dimensions to form a resistor element in a drive circuit for said laser active region;
a second conductive interconnect applied to a surface of said integrated transmitter arrangement, said second conductive interconnect forming an inductance element in said drive circuit for said laser active region; and third conductive interconnect portions applied to said surface of said integrated transmitter arrangement and forming a capacitance element in said drive circuit for said laser active region.

7. An integrated laser transmitter arrangement as claimed in claim 6, wherein said second conductive interconnect describes generally a spiral configuration to form said inductive element.

8. An integrated laser transmitter arrangement as claimed in claim 6, wherein said third conductive interconnect portions are disposed over one another, and further comprising:

a dielectric material disposed between said third conductive interconnect portions to form said capacitance element.

9. An integrated laser transmitter arrangement as claimed in claim 6, wherein said first conductive interconnect forming said resistor element connects said conductive coating overlying said laser active region to said second conductive interconnect forming said inductance element, and one of said third conductive interconnect portions is connected directly to said conductive coating overlying said laser active region.

10. An integrated laser transmitter arrangement as claimed in claim 9, further comprising:

first and second contacting surfaces for external power supplies, said first contacting surface being connected to another one of said third conductive interconnect portions forming said capacitance element, and said second contacting surface being connected to said second conductive interconnect portions forming said inductance element.

11. An integrated laser transmitter arrangement as claimed in claim 10, further comprising:

at least one further laser active region in said semiconductor layers;

a further conductive coating overlying each of said at least one further laser active region; and a further first conductive interconnects connected between each of said further conductive coating and said second contacting surface.

12. An integrated laser transmitter arrangement as claimed in claim 11, wherein each of said at least one further laser active region lies parallel to and is laterally coupled to said laser active region.

13. An integrated laser transmitter arrangement as claimed in claim 6, further comprising:

an insulating layer on said plurality of semiconductor layers; and said first and second conductive interconnects and said third conductive interconnect portions being applied on said insulating layer.

14. An integrated laser transmitter arrangement as claimed in claim 13, wherein said insulating layer includes a through opening over said laser active region, and said conductive coating extends through said through opening to provide a contact surface portion on a surface of said insulating layer and conductive coating portion overlying said laser active region.

15. An integrated laser transmitter arrangement as claimed in claim 10, wherein said first and second contacting surfaces lie adjacent edge regions of said substrate.

16. An integrated laser transmitter arrangement as claimed in claim 6, further comprising:

a metal layer applied to a side of said substrate opposite said plurality of semiconductor layers.

17. A laser transmitter arrangement as claimed in claim 1, wherein:

each of said at least one inductance element is formed as a helically arranged interconnect;

each of said at least one capacitance element is formed of two superimposed ones of said interconnects and an intervening dielectric;

each of said at least one capacitance element has one of said interconnects connected to a first external contacting surface, a second one of said interconnects of each of said at least one capacitance element is connected to one of said at least one contact surface of at least one laser strip;

each of said at least one contact surface of at least one laser strip which is connected to one of said at least one second interconnect of one of said at least one capacitance is connected to one of said at least one inductance element;

each of said at least one inductance element is connected to a second external contacting surface;

and ones of said at least one inductance element are connected to said contact surface of said laser strip by one of said resistor elements formed of a conductor and being a drop resistor and ones of said at last one inductance element are connected to said second external contacting surface by one of said resistor elements.

18. A laser transmitter arrangement as claimed in claim 17, wherein said at least one laser strip further comprises a second laser strip to provide at least two laser strips, and said at least one resistor element includes further resistor elements to provide a plurality of resistor elements, one of said plurality of resistor elements being a drop resistor connected to said contact surface of each of said at least two laser strips to form a drive component for said at least two laser strips, ones of said drop resistors being directly connected to a second external contacting surface, and remaining one of said drop resistors being connected to said second external contacting surface by said at least one inductance element.

19. A laser transmitter arrangement as claimed in claim 18, wherein said at least two laser strips extend parallel to one another and are laterally coupled.

20. A laser transmitter arrangement as claimed in claim 17, further comprising: an insulating layer disposed on said expitaxially deposited layers to electrically insulate said drive components from said epitaxially deposited layers of semiconductor material.

21. A laser transmitter arrangement as claimed in claim 1, wherein said at least one resistor element has substantially no resistance.

* * * * *